(12) United States Patent
Malhouitre et al.

(10) Patent No.: US 12,174,425 B2
(45) Date of Patent: Dec. 24, 2024

(54) METHOD FOR MANUFACTURING A MIXED LAYER COMPRISING A SILICON WAVEGUIDE AND A SILICON NITRIDE WAVEGUIDE

(71) Applicants: COMMISSARIAT A L'ENERGIE ATOMIQUE ET AUX ENERGIES ALTERNATIVES, Paris (FR); THALES, Courbevoie (FR)

(72) Inventors: Stephane Malhouitre, Grenoble (FR); David Bitauld, Massy (FR); Karim Hassan, Grenoble (FR); Joan Ramirez, Bures-sur-Yvette (FR); Alexandre Shen, Orsay (FR)

(73) Assignees: COMMISSARIAT A L'ENERGIE ATOMIQUE ET AUX ENERGIES ALTERNATIVES, Paris (FR); THALES, Courbevoie (FR)

( * ) Notice: Subject to any disclaimer, the term of this patent is extended or adjusted under 35 U.S.C. 154(b) by 214 days.

(21) Appl. No.: 17/995,875

(22) PCT Filed: Apr. 6, 2021

(86) PCT No.: PCT/EP2021/058847
§ 371 (c)(1),
(2) Date: Oct. 10, 2022

(87) PCT Pub. No.: WO2021/204749
PCT Pub. Date: Oct. 14, 2021

(65) Prior Publication Data
US 2023/0168429 A1    Jun. 1, 2023

(30) Foreign Application Priority Data
Apr. 10, 2020  (FR) .................................... 2003653

(51) Int. Cl.
*G02B 6/136*  (2006.01)
*G02B 6/132*  (2006.01)
(Continued)

(52) U.S. Cl.
CPC ............. *G02B 6/136* (2013.01); *G02B 6/132* (2013.01); *H01S 5/021* (2013.01); *H01S 5/026* (2013.01);
(Continued)

(58) Field of Classification Search
CPC .......... G02B 6/132; G02B 6/136; G02B 6/14; G02B 2006/12061; H01S 5/021; H01S 5/026; H01S 5/1032
See application file for complete search history.

(56) References Cited

U.S. PATENT DOCUMENTS 9,110,221 B2 *   8/2015  Agarwal ................ G02B 6/122
9,671,557 B1    6/2017  Ding et al.
(Continued)

FOREIGN PATENT DOCUMENTS

CN    110954998 A    4/2020

OTHER PUBLICATIONS

International Search Report mailed on May 19, 2021 in PCT/EP2021/058847 filed on Apr. 6, 2021 (citing references 1-3, and 6 therein. 2 pages).
(Continued)

*Primary Examiner* — Daniel Petkovsek
(74) *Attorney, Agent, or Firm* — Oblon, McClelland, Maier & Neustadt, L.L.P.

(57) ABSTRACT

A fabricating process may include: producing a trench, in an encapsulated-silicon layer, in the location where a silicon-nitride core of the waveguide must be produced; then depositing a silicon-nitride layer on the encapsulated-silicon layer, the thickness of the deposited silicon-nitride layer
(Continued)

being sufficient to completely fill the trench; then removing the silicon nitride situated outside of the trench to uncover an upper face with which the trench filled with silicon nitride is flush; then depositing a dielectric layer that covers the uncovered upper face in order to finalize the encapsulation of the silicon-nitride core and thus to obtain a mixed layer containing both the silicon and silicon-nitride cores encapsulated in dielectric.

13 Claims, 7 Drawing Sheets

(51) Int. Cl.
*H01S 5/02* (2006.01)
*H01S 5/026* (2006.01)
*H01S 5/10* (2021.01)
*G02B 6/12* (2006.01)
*G02B 6/14* (2006.01)

(52) U.S. Cl.
CPC .. *H01S 5/1032* (2013.01); *G02B 2006/12061* (2013.01); *G02B 6/14* (2013.01)

(56) References Cited

U.S. PATENT DOCUMENTS

| | | | |
|---|---|---|---|
| 10,270,222 | B2 | 4/2019 | Menezo |
| 11,788,841 | B2 * | 10/2023 | Paniccia ................ G02B 6/126 385/129 |
| 2014/0153600 | A1 * | 6/2014 | Luo ........................ B82Y 20/00 372/40 |
| 2014/0376857 | A1 * | 12/2014 | Chantre ................ H01S 5/1032 438/31 |
| 2015/0180201 | A1 * | 6/2015 | Zhang ..................... H01S 3/005 372/20 |
| 2016/0197111 | A1 | 7/2016 | Coolbaugh et al. |

OTHER PUBLICATIONS

Dai. D. et al., "Mode converter based on an inverse taper for multimode silicon nanophotonic integrated circuits". Optics Express, vol. 23, No. 22, Oct. 21, 2015, total 13 pages.

Duan, G.H. et al., "Hybrid III-V on Silicon Lasers for Photonic Integrated Circuits on Silicon", IEEE Journal of Selected Topics in Quantum Electronics, vol. 20, No. 4, Jul./Aug. 2014, total 13 pages.

Pu, M. et al., "Ultra-low-loss inverted taper coupler for silicon-on-insulator ridgs waveguide", Optics Communications, vol. 283, 2010, pp. 3678-3682.

Sacher. W.D. et al., "Multilayer Silicon Nitride-on-Silicon Integrated Photonic Platforms and Devices", Journal of Lightwave Technology, vol. 33, No. 4, Feb. 15, 2015, pp. 901-910.

Sun, X. et al., "Adiabaticity criterion and the shortest adiabatic mode transformer in a coupled-waveguide system", Optics Letters, vol. 34, No. 3, Feb. 1, 2009, pp. 280-282.

Szelag, et al., "Hybrid III-V/Si DFB laser integration on a 200 mm fully CMOS-compatible silicon photonics platform", IEEE, 2017, total 4 pages.

Wilmart, Q. et al., "A Versatile Silicon-Silicon Nitride Photonics Platform for Enhanced Functionalities and Applications". Applied Science, 2019, vol. 9. No. 255, total 16 pages.

* cited by examiner

METHOD FOR MANUFACTURING A MIXED LAYER COMPRISING A SILICON WAVEGUIDE AND A SILICON NITRIDE WAVEGUIDE

CROSS-REFERENCE TO RELATED APPLICATIONS

The present application is the national stage of international application PCT/EP2021/058847, filed on Apr. 6, 2021, and claims the benefit of the filing date of French Appl. No. 2 003 653, filed on Apr. 10, 2020, The invention relates to a process for fabricating a mixed layer comprising a first waveguide the core of which is made of silicon and a second waveguide the core of which is made of silicon nitride. The invention also relates to:
  a process for fabricating a photonic component using this process for fabricating a mixed layer, and
  the photonic component thus fabricated.

As described in U.S. Pat. No. 10,270,222B1 and in patent application WO2019002763A1, for example in the particular context of a semiconductor laser source, it is advantageous to use a waveguide made of III-V gain material and waveguides made of silicon and of silicon nitride. Specifically, this allows the performance and properties of the laser source to be improved. More broadly, it will be noted that photonic, III-V semiconductor components may benefit from improved performance when they are associated with waveguides made of silicon and of silicon nitride.

Below, the expression "silicon waveguide" or "waveguide made of silicon" designates a waveguide the core of which is made of silicon, and the expression "silicon-nitride waveguide" or "waveguide made of silicon nitride" designates a waveguide the core of which is made of silicon nitride.

In known processes for fabricating such photonic components, the three different waveguides are produced in respective layers that are stacked on top of one another. Thus, to fabricate these photonic components, it is necessary to fabricate a stack of at least three different layers.

The fabrication of these photonic components would therefore be simplified and their integration density would be improved if it were possible to produce a mixed layer containing, in the same level, silicon waveguides and silicon-nitride waveguides.

However, an effective and simple process for fabricating such a mixed layer does not exist. This is notably due to the fact that, at the present time, there is no simple process for carrying out chemical-mechanical polishing on a thick silicon-nitride layer covering most of the exterior face of a substrate and that, in addition, may be stopped as soon as a subjacent layer, for example of silicon oxide, is uncovered.

Technological background is known from CN110954998A, U.S. Pat. No. 9,671,557B1 and US2016/197111A1.

The invention therefore aims to mitigate this lack. One subject thereof is therefore a process for fabricating a mixed layer according to Claim 1.

Another subject of the invention is a process for fabricating a photonic, III-V semiconductor component employing the above process for fabricating a mixed layer.

Lastly, another subject of the invention is a photonic, III-V semiconductor component fabricated using the above process.

The invention will be better understood on reading the following description, which is given solely by way of non-limiting example, with reference to the drawings, in which.

In these figures, the same references are used to designate the same elements. In the remainder of this description, features and functions that are well known to those skilled in the art are not described in detail.

Below, the definitions of certain terms and expressions used in this patent application are given in Section I. Next, detailed examples of embodiments are described in Section II with reference to the figures. In the following section, Section III, variants of these embodiments are presented. Lastly, the advantages of the various embodiments are presented in Section IV.

Section I: Terminology and Definitions

In this description, when it is indicated that a waveguide is made of material X, this means that the core of this waveguide is made of this material X. The cladding of this waveguide is made of another material of lower refractive index.

When it is indicated that an element "is made of material X", this means that the material X represents more than 90% or 95% or 98%, by mass, of the weight of this element.

The effective propagation index $n_{eff}$ is also known as the "phase constant of the mode". It is defined by the following relationship: $n_g = n_{eff} - \Delta dn_{eff}/d\lambda$, where $n_g$ is the group index and $\lambda$ is the wavelength of the optical signal guided by the guide. The effective propagation index of a waveguide depends on the dimensions of the core of this waveguide and on the materials forming this core and the cladding of this waveguide. It may be determined experimentally or by numerical simulation.

The cladding of a waveguide is generally made of dielectric. In this case, the dielectric is a dielectric the refractive index $n_{md}$ of which is lower than the index $n_{Si}$ if the core of the waveguide is made of silicon and than the index new if the core is made of silicon nitride, where $n_{Si}$ and $n_{SiN}$ are the refractive indices of silicon and silicon nitride, respectively. Typically, the index $n_{md}$ is lower than or equal to $0.85 \times n_c$ or lower than or equal to $0.75 \times n_c$, where ne is the refractive index of the core of the waveguide.

By "dissolve" what is meant is the action of an operation of etching a material by wet or dry etching.

Section II: Examples of Embodiments

Figure 1:
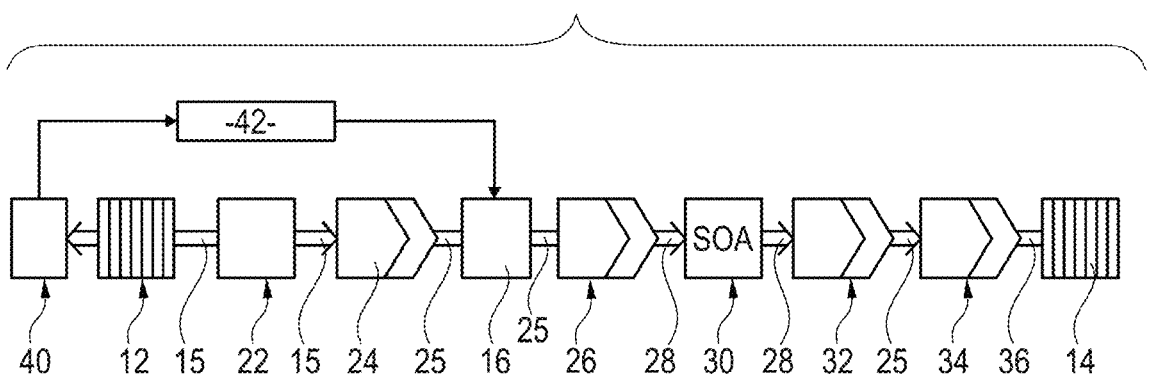
FIG. 1 is a schematic illustration of the architecture of a semiconductor laser source.

FIG. 1 schematically shows the general architecture of a monochromatic semiconductor laser source 10 that emits at the wavelength $\lambda_{Li}$. Below, only the particularities of the laser source 10 are described in detail. For general information on the operation of a semiconductor laser source using waveguides made of silicon, silicon nitride and III-V gain material, the reader may consult U.S. Pat. No. 10,270,222B1 and patent application WO2019002763A1. As will become apparent on reading the rest of the description, the laser source 10 differs from known laser sources mainly in the arrangement of its waveguides made of silicon and of silicon nitride.

The laser source 10 comprises a rear reflector 12 and a front reflector 14 that define the ends of a Fabry-Pérot cavity inside of which the optical signal resonates. For example, the reflector 12 has a reflectance strictly higher than that of the reflector 14. The reflectors 12 and 14 are, for example, wideband reflectors. Here, the reflectors 12 and 14 are reflectors such as Bragg gratings.

Between the reflectors 12 and 14, the laser source comprises in succession the following photonic components from the reflector 12 to the reflector 14:
- an optical waveguide 15 made of silicon nitride ($Si_3N_4$) in which the reflector 12 is produced,
- a bandpass filter 22 able to select the operating wavelength $\lambda_{Li}$ of the laser source 10 from various wavelengths $\Delta_{Rj}$ possible inside the Fabry-Perot cavity, this filter 22 being produced in the silicon-nitride waveguide 15,
- an inversely tapered coupler 24 that optically connects a first region of the waveguide 15 to a first region of a silicon waveguide 25,
- the silicon waveguide 25,
- an optional tuning device 16 produced in the waveguide 25, this tuning device 16 being able to move the wavelengths $\lambda_{Rj}$ as a function of an electrical control signal and using the properties of the silicon of the waveguide 25,
- an adiabatic or evanescent coupler 26 that optically connects a second region of the waveguide 25 to a facing first region of a waveguide 28 made of III-V gain material,
- a semiconductor optical amplifier 30 (also known by the acronym SOA) produced in the waveguide 28 and able to generate and to amplify the optical signal resonant inside the Fabry-Pérot cavity at each wavelength $\Delta_{Rj}$,
- an adiabatic or evanescent coupler 32 that optically connects a second region of the waveguide 28 to a facing third region of the waveguide 25,
- an inversely tapered coupler 34 that optically connects a fourth region of the waveguide 25 to a first region of the waveguide 36 made of silicon nitride ($Si_3N_4$), and
- the reflector 14 produced at the end of the guide 36.

For a detailed description of an adiabatic coupler, the reader may refer to the following article: Amnon Yariv et al., 'Supermode Si/III-V hybrid Lasers, optical amplifiers and modulators: proposal and analysis', Optics Express 9147, vol. 14, No. 15, 23 Jul. 2007.

In particular, an adiabatic coupler is able to transfer almost all of the optical signal present in a first waveguide to a second waveguide situated above or below, without reflection. Such an adiabatic coupler is, for example, obtained by modifying the width of the first waveguide with respect to the width of the second waveguide. Typically, to adiabatically couple a silicon waveguide to a waveguide made of III-V material, the width of the silicon waveguide is gradually decreased as the waveguide made of III-V material is approached. In the inverse direction, to transfer, via adiabatic coupling, an optical signal from the waveguide made of III-V material to the silicon first waveguide, the width of the silicon waveguide is for example gradually increased. In addition, waveguides made of silicon and of III-V material generally have a width such that there are regions in these facing waveguides in which their respective effective propagation indices are equal.

Figure 2:
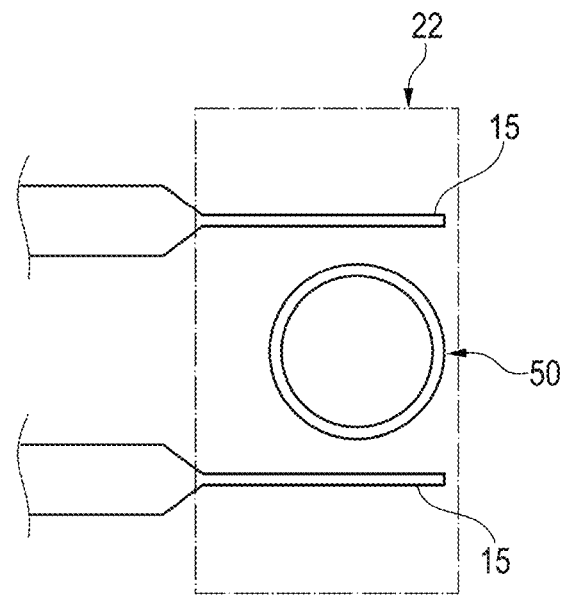
FIG. 2 is a schematic illustration of a top view of an example of a filter able to be employed in the laser source of FIG. 1.

In this embodiment, the filter 22 is a resonant ring filter the ring of which is produced in an $Si_3N_4$ waveguide 50 (FIG. 2). Preferably, the waveguide 50 in which the ring is produced is directly connected optically to two ends of the waveguide 15 via evanescent coupling. Evanescent coupling is obtained by bringing the two waveguides closer to each other. Here, the fitter 22 is identical to that described in U.S. Pat. No. 10,270,222B1 and in patent application WO2019002763A1.

To generate the electrical control signal used to control the tuning device 16, the laser source 10 also comprises a sensor 40 and an electronic circuit 42 able to generate the electrical control signal used to control the tuning device 16 so as to permanently keep one wavelength $\Delta_{Rj}$ at the centre of the passband of the filter 22. The sensor 40 and the circuit 42 are, for example, identical to those described in U.S. Pat. No. 10,270,222B1 and in patent application WO2019002763A1.

The light that exits via the reflectors 12 and 14 is then guided, for example, to a photodiode or an optical fibre. To this end, additional optical components are used. Given that these additional optical components are conventional, they are not described in detail here and, to simplify the figures, they are furthermore not shown.

Figure 3:
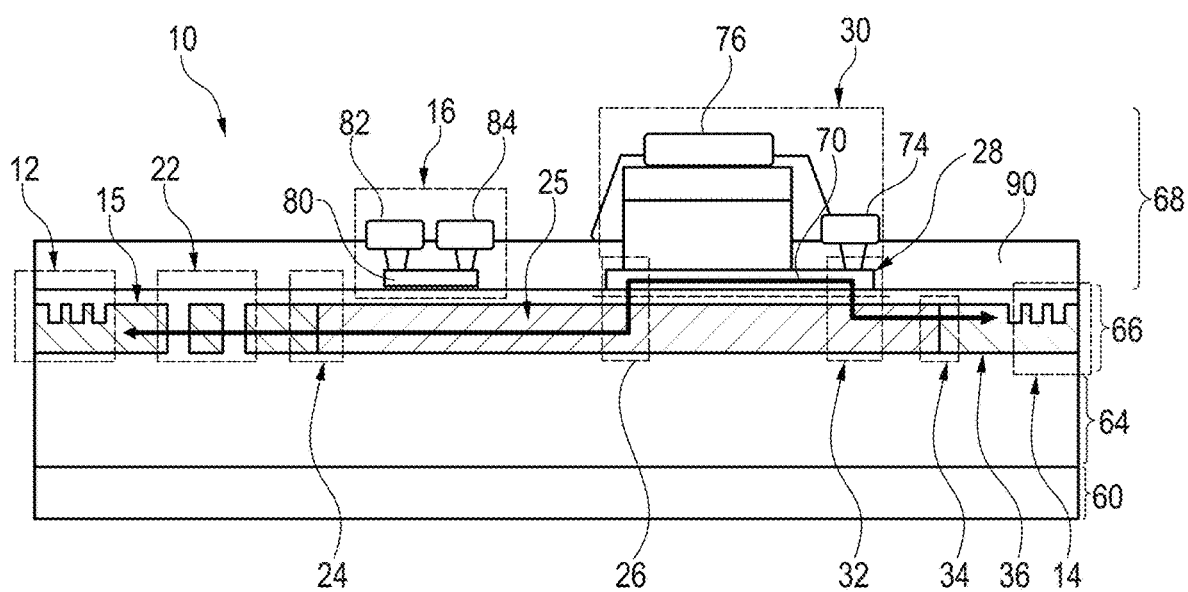
FIG. 3 is a schematic illustration of a vertical cross section of one possible embodiment of the laser source of FIG. 1.

FIG. 3 shows a first embodiment of the laser source 10. Here, the laser source 10 is fabricated on a substrate 60 made of silicon, crystalline silicon for example, that mainly lies in a horizontal plane corresponding to the plane of the substrate.

In FIG. 3, the laser source 10 comprises in succession stacked on the substrate 60 from bottom to top:
- a buried dielectric layer 64,
- a mixed layer 66 that contains the silicon-nitride waveguides 15 and 36 and the silicon waveguide 25, and
- a layer 68 made of encapsulated III-V material comprising the waveguide 28 inside of which is produced the amplifier 30 in this exemplary embodiment.

The thickness of the substrate 60 is large, i.e. larger than 100 μm or 300 μm.

The dielectric of the layer 64 is typically an oxide. Here, the buried oxide is silicon oxide, of a thickness larger than 720 nm, and preferably larger than 1.5 μm. Here, the thickness of the layer 64 is equal to 2 μm.

The adiabatic couplers 26 and 32 are produced partially in the waveguide 25 and partially in the waveguide 28.

The amplifier 30 is for example identical to the amplifier described in U.S. Pat. No. 10,270,222B1 and in patent application WO2019002763A1. In this case, the waveguide 28 and the amplifier 30 take the form of a stack of alternating sublayers of wells and of barriers made of ternary and/or quaternary materials. For example, in the case of epitaxy on an InP substrate, it may be a question of an alternation of quaternary InGaAsP or AlGaInAs with two different bandgaps for the wells and barriers. In the case of epitaxy on a GaAs substrate, it may be a question of an alternation of GaInNAs materials with two different bandgaps for the wells and barriers or of an alternation of GaInNAs and GaNAs. These alternations of wells and barriers are interposed between a lower sublayer 70 and a p-doped upper sublayer made of InP or GaAs, respectively. The sublayer 70 is a sublayer made of III-V material doped oppositely to the upper sublayer. For example, here, it is a question of an n-doped sublayer made of InP or GaAs, respectively. The amplifier 30 comprises a contact 74 making direct mechanical and electrical contact with the sublayer 70. The p-doped (InP or GaAs) sublayer makes mechanical and electrical contact with a contact 76. When a current higher than the threshold current of the laser source is applied between the contacts 74 and 76, the amplifier 30 generates and amplifies the optical signal which resonates inside the Fabry-Perot cavity.

The tuning device 16 is here a heater able to heat the waveguide 25 with a view to moving the wavelengths $\lambda_{Rj}$. In this embodiment, the tuning device 16 comprises a resistor 80 that is electrically connected to two electrical contacts 82 and 84. Typically, the resistor 80 is separated from the waveguide 25 by a distance larger than 500 nm or 600 nm. These contacts 82 and 84 are electrically connected to a current or voltage source that is controlled by the electronic circuit 42 depending on the measurements of the sensor 40.

The tuning device 16, the waveguide 28 and the amplifier 30 are covered with a protective jacket 90 that mechanically insulates them from the exterior. Only the contacts 74, 76, 82, 84 protrude beyond the jacket 90. For example, the jacket 90 is made of silicon nitride or of silicon oxide or of benzocyclobutene (BCB).

The path of the resonant optical signal through the laser source 10 is represented in FIG. 3 by a bold double-headed arrow.

FIGS. 4 to 10 show the adiabatic coupling 32 and the inversely tapered coupling 34. The couplings 26 and 24 are, for example, achieved in the same way as the couplings 32 and 34, respectively.

Figure 4:
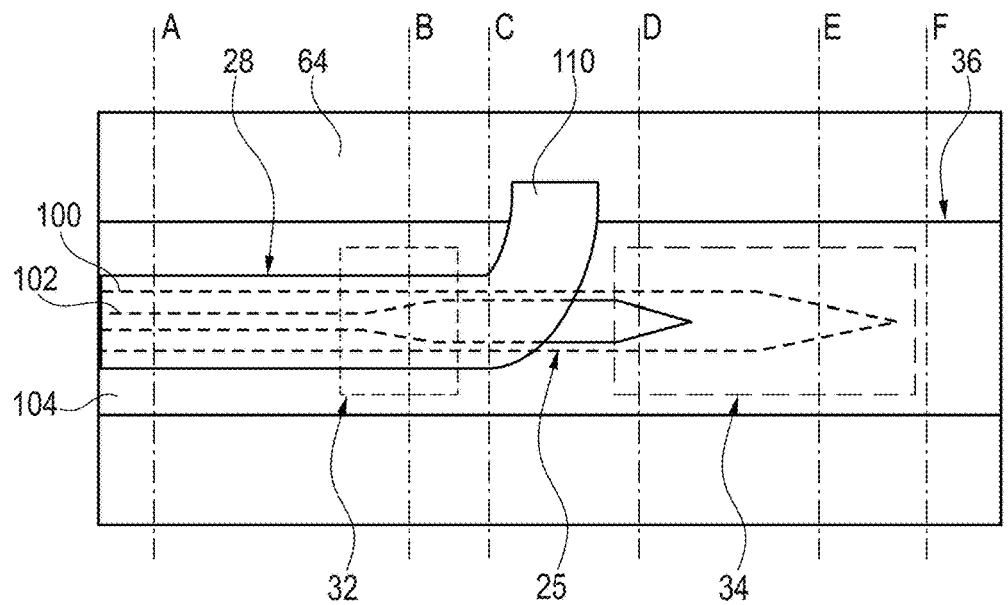
FIG. 4 is a schematic illustration of a top view of optical couplings between various waveguides of the laser source of FIG. 3.

FIG. 4 shows seen from above a segment of the waveguides 28, 25 and 36. In this FIG. 4, only the core of the guides 25, 28 and 36 and the layer 64 on which these cores rest are shown. The claddings of the guides 25, 28 and 36 are not shown. The limits of the core of the guide 25 are represented by dashed lines when they are hidden by the guide 28 or 36.

In FIGS. 5 to 10, the cladding of the guide 28 and the substrate 60 are not shown.

In FIG. 4, dash-dotted lines A to F show the positions of cross sections A to F, respectively. The cross sections A to F are shown in FIGS. 5 to 10, respectively. More precisely, from left to right:
cross section A is situated under the guide 28 and between the couplers 26 and 32,
cross section B is situated substantially in the middle of the coupler 32,
cross section C is situated between the couplers 32 and 34,
cross section D is situated at the start of the coupler 34,
cross section E is situated at the end of the coupler 34, and
cross section F is situated between the coupler 34 and reflector 14.

In this embodiment, the silicon core of the guide 25 comprises a horizontal slab 100 and a rib 102 superposed on this slab 100. Such a configuration of the guide 25 is called a rib-waveguide configuration. This rib configuration is shown in FIGS. 5 to 8.

Figures 5, 6, 7:
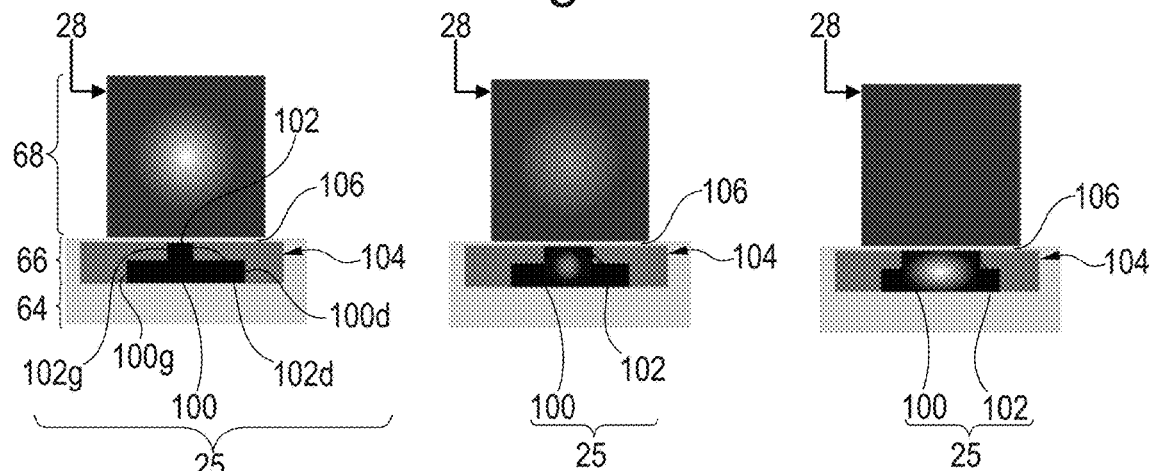
FIGS. 5 to 10 are schematic illustrations, in various cross-sectional planes, of the optical couplings of FIG. 4.

The cross section of the slab 100 is rectangular. The slab 100 therefore comprises a horizontal lower face making direct contact with the upper face of the layer 64 and, on the opposite side, a horizontal upper face. It also comprises sidewalls 100g and 100d (FIG. 5). The walls 100g and 100d extend vertically.

The cross section of the rib 102 is also rectangular. It comprises a horizontal lower face that is flush with the upper face of the slab 100 and, on the opposite side, a horizontal upper face. It also has sidewalls 102g and 102d (FIG. 5) that extend vertically.

In this embodiment, the sidewalls 100g, 100d, 102g and 102d and the upper face of the rib 102 are encapsulated in a silicon-nitride block 104. This block 104 completely covers the sidewalls 100g, 100d, 102g, 102d and the upper face of the rib 102 in the locations of the cross sections A to D. Thus, the cladding of the waveguide 25 is here made of silicon nitride at least along its sidewalls and its upper face. In FIGS. 5 to 8, the small thickness of silicon nitride that covers the upper face of the guide 25 is not visible. The block 104 is separated from the waveguide 28 by a thin dielectric layer 106. Thus, the waveguide 28 is separated from the waveguide 25 by the layer 106 and by the silicon nitride that covers the upper face of the guide 25.

In the coupler 32 (FIG. 6), the cross section of the rib 102 gradually flares from left to right so as to form, in the waveguides 25 and 28, facing regions the effective propagation indices of which are equal. In this embodiment, in the coupler 32, the cross section of the slab 100 remains constant.

Next, between the couplers 32 and 34, the cross section of the waveguide 25 remains constant (FIG. 7: cross section C).

In this embodiment, the waveguide 28 ends with an absorption region 110. This region 110 is situated after the coupler 32 and is shaped to evacuate the residual fraction of the optical signal that has not been transferred, by the coupler 32, to the waveguide 25.

From left to right, at the start of the coupler 34, the cross section of the rib 102 (FIG. 8: section D) gradually narrows to a point. To this end, the sidewalls 102g and 102d gradually approach each other before meeting at an end of the rib 102 beyond which this rib 102 no longer exists. This narrowing of the cross section of the rib 102 forms a first tapered termination. Beyond this end of the rib 102, the optical signal is therefore essentially confined to inside the slab 100. Here, from the start of the coupler 34 to the end of the rib 102, the cross section of the slab 100 remains constant.

Figures 8, 9, 10:
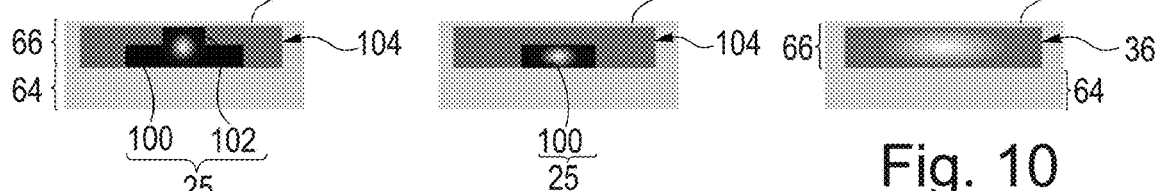

Next, beyond the end of the rib 102, the cross section of the slab 100 gradually narrows, from left to right, to a point (FIG. 9: section E). To this end, as for the rib 102, the sidewalls 100g and 100d gradually approach each other before meeting at an end of the slab 100 beyond which the waveguide 25 no longer exists and from which the guide 36 starts. This narrowing of the cross section of the slab 100 forms a second tapered termination. Thus, the guide 36 (FIG. 10: section F) is situated in the same layer 66 as the waveguide 25 and in the extension of the waveguide 25.

The cross section of the waveguide 36 is here rectangular. It therefore has a horizontal lower face that directly bears mechanically against the upper face of the layer 64 and, on the opposite side, a horizontal upper face. This waveguide 36 is therefore situated in the same level as the waveguide 25. Specifically, the horizontal lower faces of the waveguides 25 and 36 are situated in the same horizontal plane.

Beyond the end of the slab 100, most of the optical signal has been transferred from the waveguide 25 to the waveguide 36.

A process for fabricating the laser source 10 will now be described with the help of FIGS. 11 to 26. In FIGS. 20 to 26, the substrate 60 is not shown.

In FIGS. 12 to 19, only the fabrication states of the laser source in the locations of cross sections E, F and A are shown. In these figures, the locations of these cross sections A, E and F are shown by vertical dashed lines bearing the reference letters A, E and F, respectively. In FIGS. 12 to 19, by way of illustration, these cross sections are shown as being next to one another. However, in fact, they are situated behind one another in the direction of propagation of the optical signal along the waveguides 25 and 36 as shown, for example, in FIG. 4.

The process starts with a phase 118 of fabricating the mixed layer 66 on the layer 64. This phase 118 starts with a step 120 of providing a stack comprising, stacked immediately on one another, the substrate 60, the buried layer 64 of oxide and a layer 122 (FIG. 20) of single-crystal silicon. Such a stack is known as a silicon-on-insulator (SOI) stack. The thickness of the layer 64 is generally larger than 1 μm. For example, here, the thickness of the layer 64 is equal to 2 μm or 3 μm. The thickness of the layer 122 is smaller and, generally, smaller than 1 μm. For example, in this embodiment, the thickness of the layer 122 is equal to 500 nm.

In a step 124, the layer 122 is structured to produce the silicon core of the waveguide 25. For example, in this step, operations of photolithography, of etching and of removing the resist mask are carried out. In particular, given the configuration of the waveguide 25, operations are carried out so as to thin the silicon layer 122 via partial etching and to leave behind only in places a thickness of 300 nm or 150 nm of single-crystal silicon. Next, generally, an operation of completely etching the layer 122 allows the various photonic components made of single-crystal silicon to be separated from this layer 122.

Figure 12:
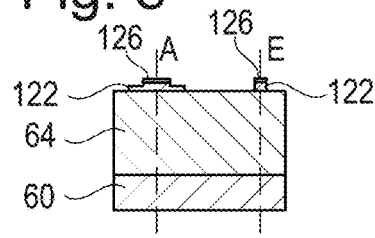
FIGS. 12 to 26 are schematic illustrations, in vertical cross section, of various fabricating states obtained when the process of FIG. 11 is implemented.
Figure 24:
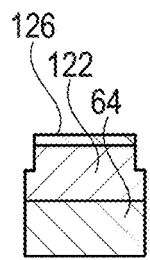

More precisely, as illustrated in more detail in FIGS. 21 to 24, typically, in step 124, a sublayer 126 (FIG. 21) of silicon oxide is deposited on top of the waveguide 25. In FIGS. 21 to 26, only one segment of the waveguide 25 the thickness of which is equal to 500 nm is shown. Here, the thickness of the sublayer 126 is for example equal to 20 nm. Next, a mask 128 (FIGS. 22 and 23), which is for example made of hard silicon nitride or of resist, is deposited in regions of the layer 122 that must not be etched. Lastly, after the etching operations, the mask 128 is removed (FIG. 24). The state shown in FIG. 12 is then reached.

Figure 13:
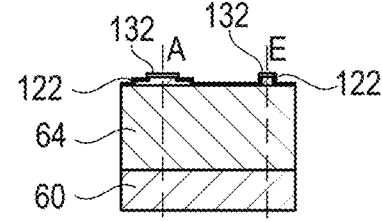
Figure 25:
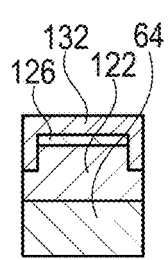
Figure 26:
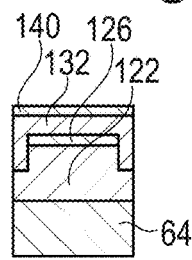

In a step 130, a thin etch-stop liner 132 (FIGS. 13 and 25) is deposited on all the upper face. Here, the liner 132 is made of silicon nitride. The thickness of the liner 132 is typically comprised between 20 nm and 100 nm or between 20 nm and 50 nm. This liner 130 in particular covers the upper face of the layer 64 uncovered by the complete etch carried out in step 124. It also covers the upper face of the core of the waveguide 25. The state obtained after the deposition of the liner 132 is shown in FIGS. 13 and 25. To simplify FIGS. 13 to 19, the residual segments of the oxide sublayer 126 that is situated under the liner 132 have not been shown in these figures.

For example, the liner 132 is deposited by plasma-enhanced chemical vapour deposition (PECVD).

Next, a step 136 of encapsulating the silicon core then of planarizing is carried out. In step 136, a dielectric 138 (FIG. 14) is deposited to encapsulate the silicon core. Here, this dielectric is silicon oxide. By way of illustration, it is a question of a high-density plasma (HDP) silicon oxide, or indeed of a silicon oxide based on tetraethylorthosilicate (TEOS). The deposited thickness of this dielectric is larger than the maximum thickness of the silicon core structured in the preceding steps. Typically, this thickness is more than 1.5 times larger than the maximum thickness of the silicon core. In addition, this thickness may be increased depending on the thickness of dielectric that it is desired to obtain above the silicon core.

Next, the upper face is planarized by carrying out chemical-mechanical polishing (CMP). This planarizing operation is stopped when the liner 132 situated above the segments of the waveguide 25 the thickness of which is equal to 500 nm is uncovered. To do this, typically, the etchant used in this operation of chemical-mechanical polishing is a selective etchant that dissolves the dielectric 138 at least two or four times more rapidly than silicon nitride.

Figure 14:
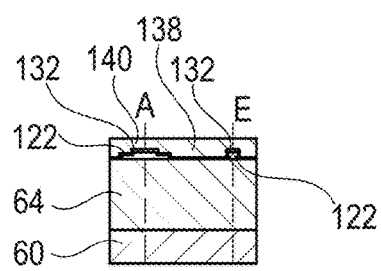
Figure 15:
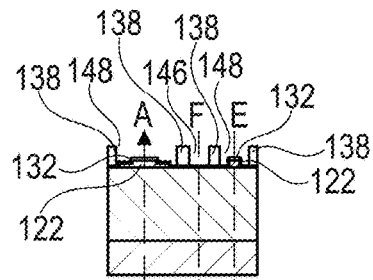
Figure 16:
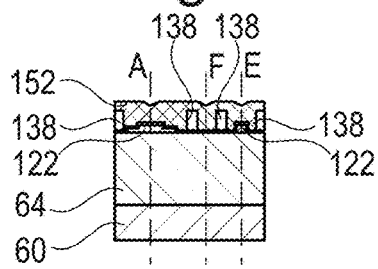
Figure 17:
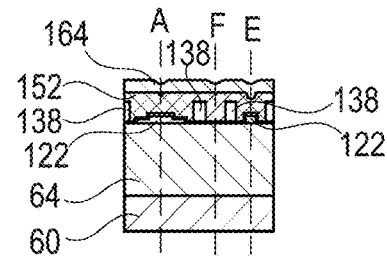

After this operation of chemical-mechanical polishing, the upper face is planar. Here, at this stage, a new sublayer 140 (FIGS. 14 and 26) of silicon oxide is deposited in order to obtain an upper face made entirely of silicon oxide. The thickness of the sublayer 140 is chosen so as to adjust the thickness of the silicon-nitride core of the waveguide 36 and the thickness of the block 104. For example, here, the thickness of the sublayer 140 is chosen to be equal to 40 nm. At the end of step 136, the encapsulated-silicon layer shown in FIG. 14 is obtained.

Next, in a step 144, a trench 146 (FIG. 15) is produced in the location where the silicon-nitride core of the guide 36 must be produced. In addition, in this embodiment, this trench comprises an extension 148 (FIG. 15) along the core of the waveguide 25 in the location where the silicon-nitride block 104 must be formed. To this end, this extension 148 uncovers the sidewalls of the core of the waveguide 25.

For example, the trench 146 and its extension 148 are produced by dry etching, through a mask, the underlayer 140 and the material 138. The dry etching is stopped when the liner 132 situated in the location of the trench 146 is uncovered. To do this, typically, the etchant used is a selective etchant that dissolves silicon oxide two or four times more rapidly than silicon nitride.

In a step 150, a layer 152 (FIG. 16) of silicon nitride is deposited on all the exterior face. The thickness of the layer 152 is sufficient to completely fill the trench 146 and its extension 148. For example, here, the thickness of the layer 152 is larger than 600 nm. For example, the layer 152 is deposited by PECVD.

In a step 160, the segments of the layer 152 deposited outside of the trench 146 and its extension 148 are removed. To do this, in this embodiment, in an operation 162, a layer 164 (FIG. 17) of silicon oxide is deposited on all the upper face of the layer 152. The thickness of the layer 164 is sufficient to completely fill the recesses formed in the layer 152 plumb with the trench 146 and its extension 148. For example, the thickness of the layer 164 is larger than 100 nm or 150 nm.

Next, in an operation 166, the layer 164 is planarized by chemical-mechanical polishing. Here, the polishing is stopped when the upper face of the layer 152 is reached. For example, the operation 166 is carried out just like the planarizing operation described with reference to step 136.

Figure 18:
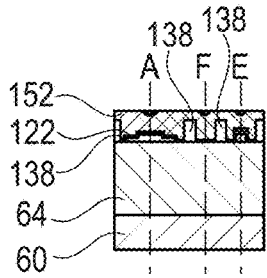

At the end of this operation, an exterior face essentially consisting of silicon nitride and of a little silicon oxide plumb with the trench 146 and with the extension 148 is obtained. The state shown in FIG. 18 is then reached. In FIG. 18, the black spots plumb with the trench 146 and with its extension 148 represent the residues of silicon oxide plumb with these elements.

Next, an operation 168 of non-selective etching is executed. In the operation 168, the etchant used dissolves silicon oxide as rapidly as silicon nitride. In this text by "dissolves element A as rapidly as element B", what is meant is the fact that the etch rate of element B is comprised between 0.8 $v_A$ and 1.2 $v_A$ and, preferably, between 0.9 $v_A$ and 1.1 $v_A$, where $v_A$ is the etch rate of element A. The operation 168 is stopped when the silicon oxide situated under the layer 152 is reached. To do this, the end of this non-selective etching is detected by optical emission spectroscopy. This process allows the material present on the exterior face during etching to be identified. As soon as the identified material is the dielectric under the layer 152, the non-selective etching is stopped. However, in practice, a small thickness, of about 20 nm, of dielectric situated under the layer 152 is nonetheless consumed. The non-selective etching applied to the planarized face of the layer 164 allows the initial planarity to be preserved. Thus, at the end of the operation 168, a planar exterior face with which the upper faces of the block 104 and of the waveguide core 36 are flush is obtained. The step 160 of removing the silicon-nitride layer 152 is then finished.

Optionally, after step 160 and in a step 169, operations of locally etching the upper face of the waveguide 36 are carried out. These operations are, for example, performed to structure the reflector 14 in the waveguide 36.

Figure 19:
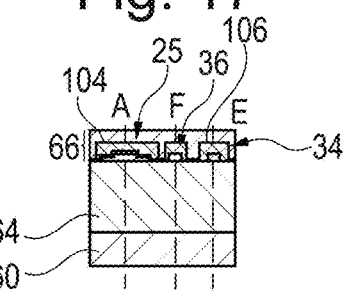
Figure 20:
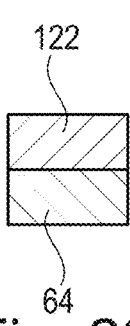
Figure 21:
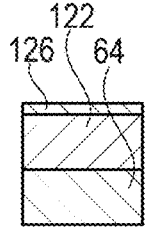
Figure 22:
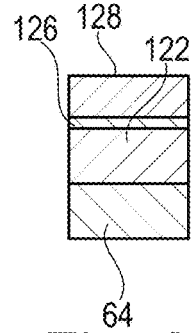
Figure 23:
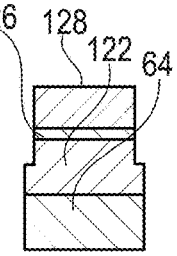

To compensate for the thickness of dielectric consumed in the operation 168 and to cover the tops of the block 104 and of the silicon-nitride core, in a step 170, the dielectric sublayer 106 is deposited on the exterior face. Here, the dielectric deposited in step 170 is silicon oxide. The state shown in FIG. 19 is then reached.

Optionally, step 170 is followed by a step 172 of planarizing the sublayer 106.

For example, at the end of step 170, the thickness of the sublayer 106 is equal to 20 nm.

The phase 118 of fabricating the mixed layer 66 is then finished.

Next, in a step 176, a transfer or a substrate made of III-V gain material is direct bonded to the mixed layer 66. This transfer or this substrate for example comprises:
  the lower sublayer 70,
  the stack of alternating sublayers of wells and of barriers made of ternary and/or quaternary materials, and
  the doped upper sublayer.

In a step 178, the transfer or the substrate is structured by etching to form the core of the waveguide 28. Typically, in a first etch, the upper sublayers of the transfer are etched to structure the amplifier 30. Next, in a second etch, the sublayer 70 is etched to complete the structuring of the amplifier 30. In step 178, the resistor 80 is also fabricated.

Lastly, in a step 180, the jacket 90 and the contacts 74, 76, 82 and 84 are produced. The layer 68 made of encapsulated III-V material is then obtained and the fabrication of the laser source 10 is finished.

Figure 27:
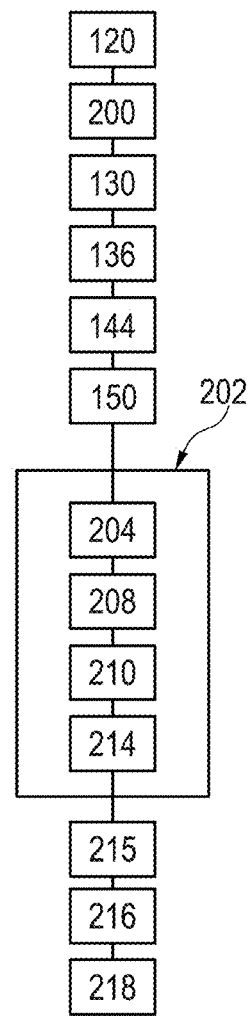
FIG. 27 is a flowchart of one process for fabricating a mixed layer capable of being implemented to produce the laser source of FIG. 3.

FIG. 27 shows a second process for fabricating the mixed layer 66 capable of being implemented instead of phase 118.

Figure 11:
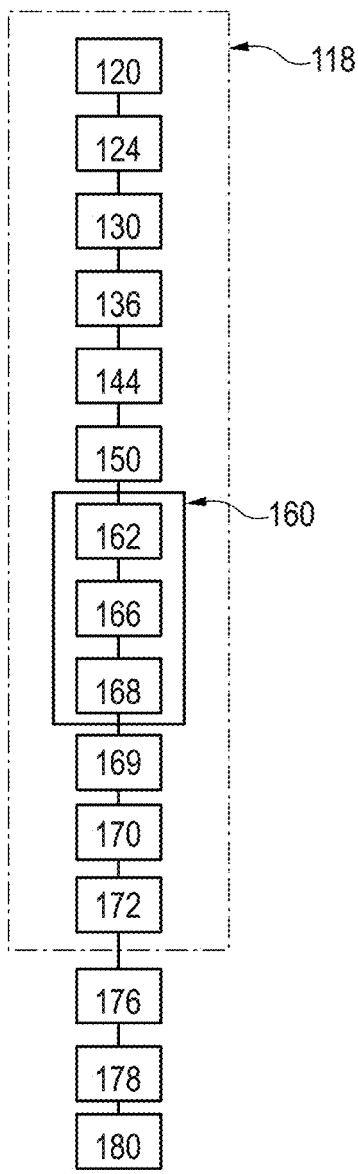
FIG. 11 is a flowchart of one process for fabricating the laser source of FIG. 3.

This second process is identical to phase 118 of FIG. 11, except that:
  step 124 is replaced by a step 200, and
  steps 160, 169, 170 and 172 are replaced by steps 202, 215, 216 and 218, respectively.

Step 200 is identical to step 124, except that the thickness of the sublayer 126 is larger than 20 nm so as to obtain a larger margin of security during the removal of the liner 132. For example, in step 200, the thickness of the sublayer 126 is larger than 30 nm or 40 nm. Here, the thickness of the sublayer 126 is equal to 40 nm.

Figure 28:
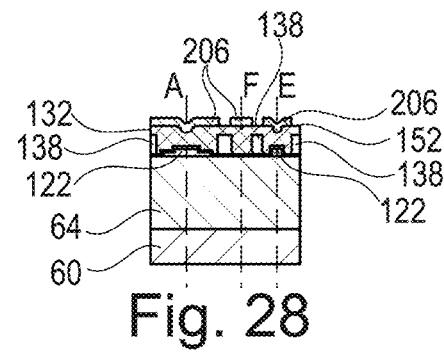
FIGS. 28 and 29 are schematic representations, in vertical cross section, of two fabricating states obtained when the process of FIG. 27 is implemented.

Step 202 starts with an operation 204 of forming a protective mask 206 (FIG. 28) plumb with the trench 146 and its extension 148. This mask 206 is designed to prevent the silicon nitride situated under this mask from being etched. For example, the mask 206 is made of resist. The state shown in FIG. 28 is then reached.

Next, an operation 208 of non-selectively etching the silicon nitride is executed. This operation 280 is stopped when the silicon oxide situated under the layer 152 is uncovered. For example, this operation is carried out as was described in the context of operation 168.

Figure 29:
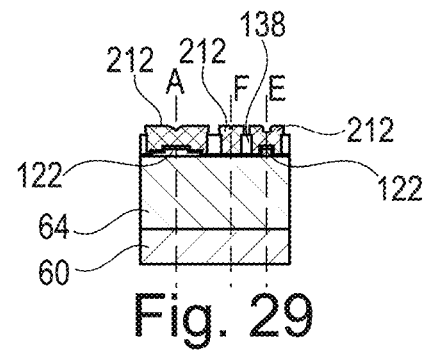

Next, in an operation 210, the mask 206 is removed. The state shown in FIG. 29 is then reached. At this stage, there is a silicon-nitride protuberance 212 above the trench 146 and its extension 148. This protuberance 212 protrudes beyond the silicon-oxide exterior face. However, the exterior face is essentially made of silicon oxide, i.e. the protuberance 212 covers less than 75% and, typically, less than 50% or less than 25% of the exterior face. The rest of the exterior face is made of silicon oxide.

In an operation 214, the exterior face is planarized by carrying out chemical-mechanical polishing in order to remove the protuberance 212. For example, in this embodiment, the operation 214 is stopped when the sublayer 126 is reached. The operation 214 decreases nonetheless by 20 nm the thickness of the sublayer 126. Step 202 of removing the layer 152 is then finished.

Optionally, after the operation 214, an operation 215 identical to the operation 169 is executed.

Next, in an operation 216, the sublayer 106 is deposited. This operation is for example identical to the operation 170.

Lastly, an optional operation 218 of planarizing the sublayer 106 is carried out. The operation 218 is identical to the operation 172.

Here, at the end of the operation 218, the thickness of the deposited sublayer 106 is larger than 50 nm or 80 nm. For example, the thickness of the deposited sublayer 106 is equal to 80 nm.

The process for producing the mixed layer 66 is then finished.

Figure 30:
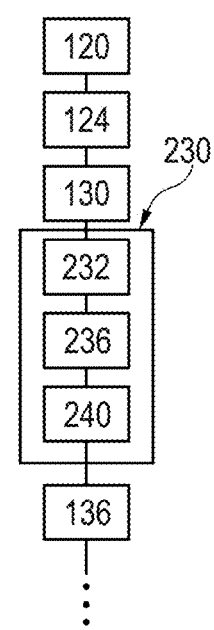
FIG. 30 is a flowchart of another process for fabricating a mixed layer capable of being implemented to fabricate the laser source of FIG. 3.

FIG. 30 shows a third process for fabricating the mixed layer 66 capable of being implemented instead of phase 118 in the process of FIG. 11. This third process is identical to phase 118, except that it comprises, between steps 130 and 136, an additional step 230 of producing a cavity under the waveguide 36.

More precisely, in an operation 232, the liner 132 is etched to form apertures 234 (FIG. 31) in this liner 132. These apertures 234 extend along the location where the guide 36 must be produced. Here, these apertures 234 also extend along the location where the block 104 must be produced.

Figure 31:
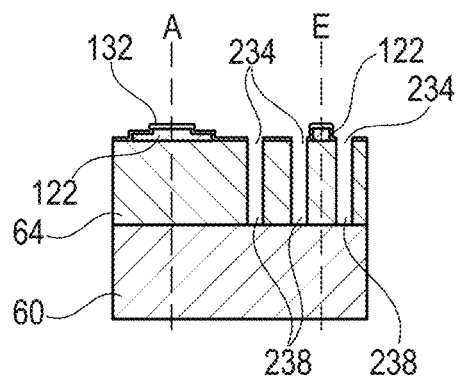
FIGS. 31 to 33 are schematic illustrations, in vertical cross section, of various fabricating states obtained when the process of FIG. 30 is implemented.
Figure 32:
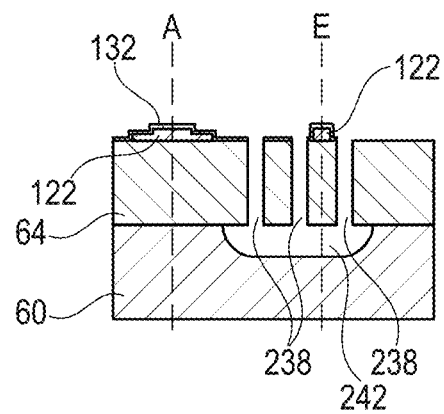

Next, in an operation 236, trenches 238 that pass right through the thickness of the layer 64 are produced using the liner 132 as etch mask. These trenches 238 each emerge onto the substrate 60. The state shown in FIG. 31 is then reached.

In an operation 240, the substrate 60 is etched to form a cavity 242 inside the substrate 60. To do this, a selective etchant is introduced into the trenches 238. This etchant dissolves silicon two or four times more rapidly than silicon oxide. In addition, it is here a question of an isotropic etchant, i.e. an etchant that dissolves silicon at the same rate in the vertical direction and in the horizontal direction. Thus, at the end of the operation 240, the cavity 242 extends under the location where the guide 36 and the block 104 must be produced. Here, the cavity 242 also extends under the location where the coupler 34 must be produced.

Figure 33:
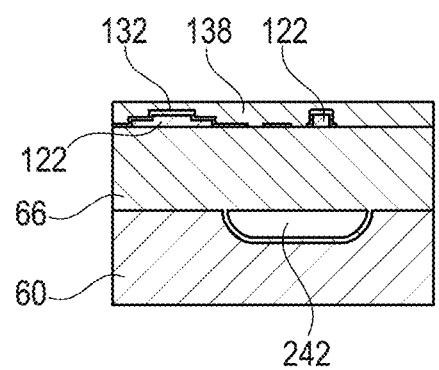

Next, the trenches 238 are filled. For example, here, this is carried out in step 136. Specifically, the deposition of the dielectric 138 in step 136 fills the trenches 238. The state shown in FIG. 33 is then reached, at the end of step 136.

From step 136, the process for fabricating the mixed layer 66 is for example identical to that already described with reference to FIG. 11 or 27. The dots in FIG. 30 indicate that the steps that follow step 136 have not been shown.

The cavity 242 allows the guide 36 to be distanced from the substrate 60 and this guide 36 to be better isolated from the substrate 60. This improvement in the isolation between the waveguide 36 and the substrate 60 decreases optical losses, notably when the transverse dimensions of the guide 36 are small.

Figure 34:
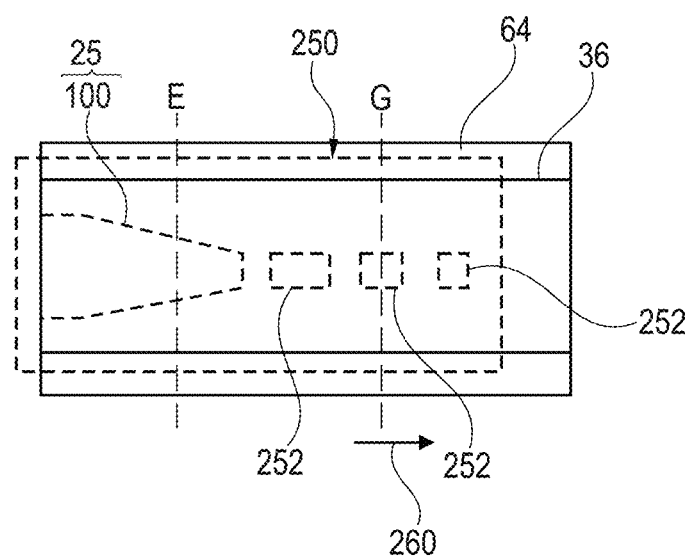
FIG. 34 is a schematic illustration of a top view of another embodiment of an optical coupler between a silicon waveguide and a silicon-nitride waveguide.
Figure 35:
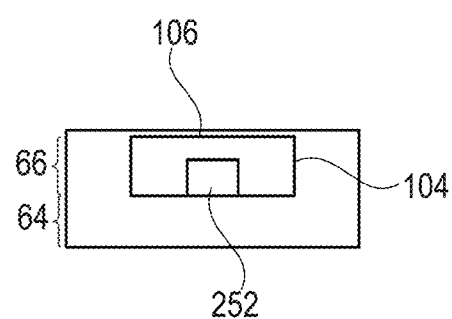
FIG. 35 is a schematic illustration of a vertical section of the optical coupler of FIG. 34.

FIGS. 34 and 35 show an inversely tapered coupler 250 capable of being used instead of the coupler 34. The dashed line G in FIG. 34 shows the location of cross section G of the coupler 250. FIG. 35 shows cross section G. The coupler 250 is identical to the coupler 34, except that the tapered termination of the slab 100 of the waveguide 25 is replaced by a tapered termination comprising subwavelength features. In this embodiment, beyond the tapered termination of the slab 100, the coupler 250 comprises features 252 that are aligned one after the other in the direction 260 of propagation of the optical signal at the wavelength $\lambda_{Li}$. Each feature 252 is made of silicon and entirely encapsulated in the silicon-nitride block 104. The horizontal dimensions of these features are smaller than the wavelength $\Delta_{Li}$. In addition, the length of the features 252 in the direction 260 decreases with distance from the tapered termination. The cross section of each feature 252 is for example rectangular. In this embodiment, the coupler 250 comprises three features 252.

Section III: Variants

Variants of the Laser Source:

The waveguide 15 may be made of silicon.

Other embodiments of the waveguide 25 are possible. For example, as a variant, the rib 102 is omitted. In this case, the waveguide 25 is a slab waveguide. In this case, the coupler 34 comprises a single tapered termination, i.e. that produced by narrowing the cross section of the slab 100.

In another variant, the upper face of the rib 102 is flush with the upper face of the block 104.

The cladding of the waveguide 25 is not necessarily made of silicon nitride. It may also be made of silicon oxide for example. In this case, the silicon-nitride block 104 is omitted from the segment of the guide 25 situated before the coupler 34. The dielectric situated between the waveguides 28 and 25 then comprises no thickness of silicon nitride.

Many variants of the laser source are possible. For example, the couplers 26 and 32 may be produced differently. Thus, by way of example, the tapered termination may be produced in the guide 25 and/or in the guide 28.

Other embodiments of the couplers 24 and 34 are possible. In particular, these couplers are not necessarily produced using an inversely tapered transition. For example, as a variant, if the cross-sectional area of the waveguide 25 is small, i.e. typically smaller than 100 nm×100 nm, then butt coupling may be employed. In this case, the cladding of the waveguide 25 is generally made entirely from a dielectric different from silicon nitride, such as silicon oxide.

The various variants of a semiconductor laser source described in U.S. Pat. No. 10,270,222B1 and in patent application WO20190027631 are applicable to a laser source comprising a mixed layer as described in this patent application. In particular, there are many other possible embodiments for the filter 22 and the reflectors 12 and 14.

As a variant, the filter 22 is produced in the silicon waveguide 25.

Up to now, the laser source has been described in the particular case where it is a question of a DBR laser source (DBR being the acronym of distributed Bragg reflector). However, a mixed layer such as the mixed layer 66 may also be used to produce a DFB laser source (DFB being the acronym of distributed feedback). In the latter case, the silicon-nitride waveguide is also situated in the extension of the silicon waveguide produced under the waveguide made of III-V material. In contrast, the Bragg grating is produced in the silicon waveguide or in a silicon-nitride sublayer interposed between the silicon waveguide and the waveguide made of III-V material.

Variants of the Processes for Fabricating the Mixed Layer:

In step 120, the layer 122 may also be made of amorphous silicon.

Other embodiments of the step 124 of structuring the silicon core are possible. For example, the silicon-oxide sublayer 126 may be omitted.

In step 124, the structuring of the silicon core may also comprise local thickness-increasing operations (either growth of single-crystal silicon or deposition of amorphous silicon, or deposition of amorphous silicon followed by a recrystallisation by heat treatment) to locally increase the thickness of the silicon core. In this case, the initial thickness of the single-crystal silicon layer 122 may be small. For example, the initial thickness of the layer 122 is then 300 nm.

In step 130, the etch-stop liner 132 may be made from materials other than silicon nitride. For example, it may be made of $Al_2O_3$ or $HfO_2$. In this case, the lower face of the guide 36 is situated at a level slightly above the lower face of the guide 25. Typically, the height difference between these two lower faces however remains smaller than 100 nm and, generally, smaller than 50 nm.

In operation 162, a material other than silicon oxide may be used provided that this material may be planarized then etched as described in operations 166 and 168.

In operation 166, the chemical-mechanical polishing of the silicon-oxide layer may also be stopped before the silicon-nitride layer 152 is reached. In this case, there is, at the end of this polishing operation, a residual silicon-oxide layer that completely covers the silicon-nitride layer 152. Next, this residual layer is completely removed in the operation 168 of non-selective etching.

In another variant, the operation 168 of non-selective etching is continued until the liner 132 or the sublayer 126 is reached. In this case, at least some or all of the silicon-nitride liner 132 is also removed.

In the operation 170, a dielectric other than silicon oxide may be deposited to form the sublayer 106. Typically, this other dielectric is then chosen to allow a good direct bonding of the transfer or substrate made of III-V material to be achieved.

In step 176, instead of bonding a transfer or substrate made of III-V gain material, it is possible to deposit this material on the mixed layer 66.

As a variant, the operation 208 of non-selectively etching the silicon nitride is stopped before the sublayer 126 is reached. For example, it is stopped when the sublayer 140 is reached.

The phase of fabricating a mixed layer may be implemented in processes other than a process for fabricating a laser source. In particular, the described process is also suitable for fabricating a mixed layer in which the waveguides made of silicon and of silicon nitride contained in this mixed layer are not optically coupled to each other by an optical coupler such as the couplers 24 and 34. For example, the optical coupling between these two waveguides may be achieved using an optical coupler at least one portion of which is produced in a layer situated above or below the mixed layer. The processes described here also allow a mixed layer in which the waveguides made of silicon and of silicon nitride are not optically coupled to each other to be produced. In this case, the production of an optical coupler such as the couplers 24 and 34 is omitted.

For example, the process for fabricating a mixed layer described here may be used to fabricate a mixed layer of photonic components other than a laser source. For example, this process may be used to fabricate a mixed layer comprising the electrodes of an optical modulator. It may also be used to fabricate the mixed layer of any photonic component comprising a layer made of Ill-V material stacked on the mixed layer. For example, the processes described here may be implemented during the fabrication of the following photonic components: a semiconductor optical amplifier (SOA), an electro-absorption modulator (EAM), a photo-diode. For example, an SOA may be obtained from the photonic component of FIG. 1 by omitting the reflectors 12 and 14 and the filter 22. An EAM may be obtained from the component of FIG. 1 by omitting the reflectors 12 and 14, the filter 22 and by shortening the length of the component 30. The processes described here for fabricating the mixed layer may also be implemented to fabricate the following photonic components:

- a transmitter comprising a plurality of laser sources that emit optical signals at various wavelengths and, produced in the silicon-nitride waveguide, a multiplexer of the type known as an arrayed waveguide grating (AWG),
- a receiver comprising a plurality of photodetectors and, produced in the silicon-nitride waveguide, an AWG demultiplexer,
- a set of a plurality of wideband semiconductor optical amplifiers connected to the entrance and/or exit of an AWG multiplexer/demultiplexer that splits the optical signals amplified at various wavelengths, the AWG multiplexer/demultiplexer being produced in the silicon-nitride waveguide,
- wavemeters using the different thermo-optic coefficient of silicon nitride,
- optical combs generated by solid bodies pumped by laser diode.

The processes described here for fabricating a mixed layer may also be implemented in processes for fabricating photonic components that comprise no layer made of encapsulated III-V material.

Other Variants:

The mixed layer may comprise additional waveguides made of silicon or of silicon nitride. For example, one of these additional waveguides is optically connected to the exit of the reflector 12 or 14.

Alternatively, by inverting the polarity of the supply signal between the contacts 74, 76 of the amplifier 30, the input optical signal is absorbed instead of being amplified. The amplifier 30 is then used to carry out photo-detection or signal modulation.

As a variant, these photonic components, and in particular the photonic components, such as the laser source 10, comprising a layer made of Ill-V material stacked on the mixed layer, may be fabricated using a process for fabricating the mixed layer 66 other than those described here. Thus, the embodiments of the laser source described here may be implemented independently of the processes that have been described for fabricating this mixed layer.

Section IV: Advantages of the Described Embodiments

The processes for fabricating a mixed layer that have been described here are simple. Specifically, they do not require the substrate to be flipped. Thus, all the etching, planarizing and depositing steps required to produce the mixed layer are carried out on the same side of this substrate 60.

The processes for fabricating a mixed layer that have been described here thus allow a higher integration density to be obtained than the known processes. Specifically, known processes transfer a silicon-nitride transfer and/or a single-crystal-silicon transfer to the layer 64. In the former case, a space of several hundred microns must necessarily exist between these silicon and silicon-nitride transfers. Thus, the cores made of silicon and of silicon nitride that are produced by structuring these transfers are necessarily spaced apart from each other by several hundred microns.

The use of a stop liner allows the bottom of the trench 146 to be precisely positioned at less than 100 nm from the upper face of the layer 64. Thus, this in the end allows a silicon-nitride core and a silicon core the lower faces of which are situated in levels that are spaced apart from each other by a distance smaller than 100 nm and that are both situated at less than 100 nm from the layer 64 to be obtained.

When the liner 132 is made of silicon nitride, the lower faces of the cores made of silicon and of silicon nitride are situated in the same horizontal plane.

The production of an extension of the trench 146 above the one or more tapered terminations of the silicon core allows an optical coupling to be obtained, between the waveguides made of silicon and of silicon nitride, that occurs entirely inside the mixed layer. It is therefore not necessary, to achieve this coupling, to use an additional layer situated above or below this mixed layer.

The fact of forming the cladding of the guide 25 from silicon nitride allows the optical properties of the silicon waveguide to be improved.

The use of a mixed layer to fabricate a photonic component allows the integration density of this photonic component to be increased. Specifically, it is no longer necessary to have silicon waveguides in a first layer and silicon-nitride waveguides in a second layer situated above or below this first layer.

The invention claimed is:

1. A process for fabricating a mixed layer containing a first waveguide with a silicon core and a second waveguide with a silicon nitride core, the process comprising:

(1) providing a substrate on which are stacked, in order, a buried dielectric layer and a silicon layer, the substrate lying in a substrate plane, and the layers lying parallel to the substrate plane; then
(2) structuring the silicon layer to form the silicon core of the first waveguide; then
(3) encapsulating the silicon core in a first dielectric, then planarizing the first dielectric, to form an encapsulated-silicon layer comprising the silicon core;
(4) producing a trench, in the encapsulated-silicon layer, in a location where the silicon nitride core of the second waveguide is to be produced; then
(5) depositing a silicon nitride layer on the encapsulated-silicon layer, the silicon nitride layer completely covering the encapsulated-silicon layer, and a thickness of the silicon nitride layer deposited completely filling the trench; then
(6) removing a first silicon nitride situated outside of the trench to uncover an upper face of the encapsulated-silicon layer, flush with the trench filled with a second silicon nitride, thus obtaining the silicon nitride core of the second waveguide; then
(7) depositing a second dielectric layer that covers an uncovered portion of the upper face to finalize encapsulation of the silicon nitride core, thus obtaining a mixed layer comprising both the silicon core and the silicon-nitride core encapsulated in the first dielectric and the second dielectric.

2. The process of claim 1, wherein the removing (6) comprises:
depositing a silicon oxide layer on all of the silicon nitride layer; then
carrying out chemical-mechanical polishing on the silicon oxide layer to obtain a second exterior face that is more planar than a first exterior face of the silicon nitride layer; then
non-selectively etching the first exterior face until the first dielectric situated under the silicon nitride layer is uncovered, thus obtaining a planar upper face flush with the trench filled with the second silicon nitride, the non-selectively etching being carried out by exposing the first exterior face to an etchant that dissolves silicon oxide as rapidly as silicon nitride.

3. The process of claim 1, wherein the removing (6) comprises:
forming a protective mask that covers a region of the silicon nitride layer situated plumb with the trench, the protective mask leaving a majority of a first most of the exterior face of the silicon nitride layer directly exposed outwardly; then
etching the exterior face of the silicon nitride layer until the first dielectric situated under the silicon nitride silicon-nitride layer is uncovered, with a second etchant that dissolves silicon nitride ten times more rapidly than the protective mask; then
removing the protective mask to obtain a second exterior face, formed by dielectric uncovered and by silicon nitride protuberances in place of removed portions of the protective mask; then
carrying out chemical-mechanical polishing on the second exterior face to obtain the upper face of the encapsulated-silicon layer, flush with the trench filled with the second silicon nitride.

4. The process of claim 1, further comprising, after the structuring (2) and before the encapsulating (3):
(2a) depositing on a buried dielectric layer, and in a location in which the trench is to be produced, an etch-stop liner with a thickness of less than 100 nm; then
wherein, in the encapsulating (3), the first dielectric used to encapsulate the silicon core is different from the etch-stop liner material used to form the etch-stop liner; and
wherein, the producing (4) comprises:
producing the trench by etching with a third etchant through a mask that only exposes the upper face of the encapsulated-silicon layer in the location where the trench is to be produced, the third etchant dissolves the first dielectric at least twice as rapidly as etch-stop liner material used to produce the etch-stop liner; then
stopping the etching with the third etchant when the etch-stop liner is reached.

5. The process of claim 4, wherein the etch-stop liner comprises silicon nitride.

6. The process of claim 1, wherein the structuring (2) comprises structuring a single-crystal silicon core with sidewalls that, at a first end of the single-crystal silicon core, get closer to each other so as to form a tapered termination beyond which an optical signal no longer propagates inside the first waveguide,
wherein the producing (4) comprises producing an extension of the trench, the extension uncovering the sidewalls of the single-crystal silicon core at least at the tapered termination, and
wherein, in the depositing (5), the silicon nitride layer also forms a silicon nitride block that covers exposed sidewalls of the single-crystal silicon core.

7. The process of claim 6, wherein, in the producing (4), the extension of the trench uncovers the sidewalls of the single-crystal silicon core over an entire length of the single-crystal silicon core, and
wherein, in the depositing (5), the silicon nitride layer forms the silicon nitride block, which covers an entirety of the sidewalls of the single-crystal silicon core, the silicon nitride block thus forming a segment of a cladding of the first waveguide.

8. A process for fabricating a photonic, III-V semiconductor component, the process comprising:
fabricating a mixed layer comprising the first waveguide and the second waveguide by the process of claim 1, to produce a fabricated mixed layer; then
producing a thickness of III-V material directly on the fabricated mixed layer; then
structuring the thickness of the III-V material to form a III-V material core of a third waveguide comprising the III-V material; then
encapsulating in a third dielectric the core of the third waveguide to form a cladding of the third waveguide; and
achieving adiabatic coupling between the third waveguide and the first waveguide.

9. A photonic, III-V semiconductor component, fabricated by the process of claim 8, the photonic component comprising, stacked in order:
a substrate;
a mixed layer comprising the first waveguide and the second waveguide; and
a layer comprising, encapsulated, the III-V material core of the third waveguide;

wherein the substrate lies in a substrate plane, and the layers lying parallel to the substrate plane, and wherein there is adiabatic coupling between the third waveguide and the first waveguide.

10. The photonic component of claim 9, wherein the silicon core of the first waveguide comprises first and second sidewalls that each extend in a direction perpendicular to the substrate plane, and, at an end of the first waveguide, the sidewalls get closer to each other to form a tapered termination beyond which an optical signal no longer propagates inside the first waveguide but rather inside the second waveguide;

wherein a segment of cladding of the first waveguide, the segment covering the sidewalls of the silicon core over an entire length of the tapered termination, comprises silicon nitride, wherein the silicon nitride core of the second waveguide is situated inside the mixed layer in an extension of the tapered termination of the silicon core, and wherein the silicon nitride core of the second waveguide forms a single block of material with the segment of the cladding of the first waveguide covering the sidewalls, thereby optically coupling the second waveguide to the first waveguide.

11. The photonic component of claim 10, which is a laser source configured to emit an optical signal at at least one wavelength, $\lambda_{Li}$, the laser source having an optical cavity suitable to make an optical signal resonate at the wavelength, $\lambda_{Li}$, wherein the optical cavity comprises:

the third waveguide, comprising the III-V material core, configured to amplify the optical signal at the wavelength, $\lambda_{Li}$, that propagates along the III-V material core, the third waveguide being situated inside a encapsulated III-V material layer;

the first waveguide; and the second waveguide.

12. The process of claim 1, wherein the first dielectric and the second dielectric are identical.

13. The process of claim 1, wherein the first dielectric and the second dielectric are different.

* * * * *

UNITED STATES PATENT AND TRADEMARK OFFICE
CERTIFICATE OF CORRECTION

| | | |
|---|---|---|
| PATENT NO. | : 12,174,425 B2 | Page 1 of 1 |
| APPLICATION NO. | : 17/995875 | |
| DATED | : December 24, 2024 | |
| INVENTOR(S) | : Malhouitre et al. | |

It is certified that error appears in the above-identified patent and that said Letters Patent is hereby corrected as shown below:

In the Claims

In Column 15, Claim 3, Line 51, after "first" delete "most of the"

In Column 15, Claim 3, Line 56, before "layer" delete "silicon-nitride"

Signed and Sealed this
Twenty-ninth Day of April, 2025

Coke Morgan Stewart
*Acting Director of the United States Patent and Trademark Office*